(12) United States Patent
Meyer-Berg (10) Patent No.: US 8,183,677 B2
(45) Date of Patent: May 22, 2012

(54) DEVICE INCLUDING A SEMICONDUCTOR CHIP (75) Inventor: Georg Meyer-Berg, Munich (DE)

(73) Assignee: Infineon Technologies AG, Neubiberg (DE)

( * ) Notice: Subject to any disclaimer, the term of this patent is extended or adjusted under 35 U.S.C. 154(b) by 475 days.

(21) Appl. No.: 12/324,420

(22) Filed: Nov. 26, 2008

(65) Prior Publication Data

US 2010/0127386 A1 May 27, 2010

(51) Int. Cl.
H01L 23/02 (2006.01)
(52) U.S. Cl. ........ 257/686; 257/691; 257/698; 257/700; 257/724; 257/738; 257/790
(58) Field of Classification Search .................. None
See application file for complete search history.

(56) References Cited

U.S. PATENT DOCUMENTS

| 5,144,747 | A  | * | 9/1992  | Eichelberger ............... 29/834 |
| 5,250,843 | A  | * | 10/1993 | Eichelberger ............... 257/692 |
| 5,353,498 | A  | * | 10/1994 | Fillion et al. ............... 29/840 |
| 5,366,906 | A  | * | 11/1994 | Wojnarowski et al. ........ 438/17 |
| 6,444,498 | B1 |   | 9/2002  | Huang et al. |
| 6,720,650 | B2 |   | 4/2004  | Chu |
| 7,129,570 | B2 | * | 10/2006 | Meyer-Berg ............... 257/678 |
| 7,145,228 | B2 |   | 12/2006 | Yean |
| 7,176,059 | B2 | * | 2/2007  | Meyer-Berg ............... 438/110 |
| 7,276,783 | B2 |   | 10/2007 | Goller et al. |
| 7,317,251 | B2 | * | 1/2008  | Meyer-Berg ............... 257/724 |
| 7,459,781 | B2 | * | 12/2008 | Yang et al. ............... 257/700 |
| 7,514,767 | B2 | * | 4/2009  | Yang ............... 257/666 |
| 7,667,318 | B2 | * | 2/2010  | Yang et al. ............... 257/700 |
| 7,868,445 | B2 | * | 1/2011  | Kohl et al. ............... 257/690 |
| 2004/0164400 | A1 | * | 8/2004  | Meyer-Berg ............... 257/693 |
| 2005/0035440 | A1 |   | 2/2005  | Mohammed |
| 2005/0280016 | A1 | * | 12/2005 | Mok et al. ............... 257/99 |
| 2006/0014318 | A1 | * | 1/2006  | Meyer-Berg ............... 438/108 |
| 2006/0060954 | A1 | * | 3/2006  | Meyer-Berg ............... 257/685 |
| 2006/0125072 | A1 | * | 6/2006  | Mihara ............... 257/686 |
| 2007/0035004 | A1 | * | 2/2007  | Konishi et al. ............... 257/686 |
| 2007/0114654 | A1 |   | 5/2007  | Coffy |
| 2007/0176317 | A1 | * | 8/2007  | Morita et al. ............... 264/138 |
| 2008/0237839 | A1 | * | 10/2008 | Ino ............... 257/704 |
| 2008/0265383 | A1 |   | 10/2008 | Brunnbauer et al. |
| 2008/0315391 | A1 | * | 12/2008 | Kohl et al. ............... 257/690 |
| 2009/0236749 | A1 | * | 9/2009  | Otremba et al. ............... 257/774 |
| 2009/0273075 | A1 | * | 11/2009 | Meyer-Berg ............... 257/693 |
| 2010/0006988 | A1 | * | 1/2010  | Tang et al. ............... 257/659 |
| 2010/0112756 | A1 | * | 5/2010  | Amrine et al. ............... 438/113 |
| 2010/0127386 | A1 | * | 5/2010  | Meyer-Berg ............... 257/698 |

* cited by examiner

Primary Examiner — David E Graybill
(74) Attorney, Agent, or Firm — Dicke, Billig & Czaja, PLLC (57) ABSTRACT A device including a semiconductor chip. One embodiment provides a device, including a metal layer having a first layer face. A semiconductor chip includes a first chip face. The semiconductor chip is electrically coupled to and placed over the metal layer with the first chip face facing the first layer face. An encapsulation material covers the first layer face and the semiconductor chip. At least one through-hole extends from the first layer face through the encapsulation material. The at least one through-hole is accessible from outside the device.

17 Claims, 9 Drawing Sheets

DEVICE INCLUDING A SEMICONDUCTOR CHIP

BACKGROUND

This invention relates to a device including a semiconductor chip and a method of manufacturing thereof.

Miniaturization is a continuing trend in integrated circuit packaging technology toward smaller scales for semiconductor devices. Various techniques may be used to produce smaller semiconductor packages, such as chip scale packaging, wafer level packaging or chip stacking.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Devices containing one or more semiconductor chips are described below. The semiconductor chips may be of different types, may be manufactured by different technologies and may include for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, magnetic field sensors, electromagnetic field sensors, microphones etc. The semiconductor chips may be configured as antennas and/or discrete passives and/or chip stacks. Semiconductor chips in which such functional elements are embedded generally contain electronic circuits which serve for driving the functional elements or further processing signals generated by the functional elements. The semiconductor chips need not be manufactured from specific semiconductor material, for example, Si, SiC, SiGe, GaAs, and, furthermore, may contain inorganic and/or organic materials that are not semiconductors, such as for example, discrete passives, antennas, insulators, plastics or metals. Moreover, the semiconductor chips may be packaged or unpackaged.

The semiconductor chips may have contact elements (or contact pads or electrodes) which allow electrical contact to be made with the integrated circuits included in the semiconductor chips. One or more metal layers may be applied to the contact elements of the semiconductor chips. The metal layers may be manufactured with any desired geometric shape and any desired material composition. The metal layers may, for example, be in the form of a layer covering an area. Any desired metal or metal alloy, for example, from aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The devices may contain one or more metal layers. The metal layers may, for example, be used to produce a redistribution layer. The metal layers may be used as wiring layers to make electrical contact with the semiconductor chips from outside the devices or to make electrical contact with other semiconductor chips and/or components contained in the devices. The metal layers may be manufactured with any desired geometric shape and any desired material composition. The metal layers may, for example, be composed of conductor tracks, but may also be in the form of a layer covering an area. Any desired metals, for example, copper, aluminum, nickel, palladium, silver, tin or gold, metal alloys or metal stacks may be used as the material. The metal layers need not be homogenous or manufactured from just one material, that is to say various compositions and concentrations of the materials contained in the metal layers are possible. Furthermore, the metal layers may be arranged above or below or between electrically insulating layers.

The semiconductor chips may be placed on carriers. The carriers may be of any shape, size or material. During the fabrication of the devices the carriers may be connected to each other. The carriers may also be made from one piece. The carriers may be connected among each other by connection means with the purpose of separating some of the carriers in the course of the fabrication. Separation of the carriers may be carried out by mechanical sawing, a laser beam, cutting, stamping, milling, etching or any other appropriate method. The carriers may be electrically conductive. They may be fabricated from metals or metal alloys, for example, copper, copper alloys, iron nickel, aluminum, aluminum alloys, or other appropriate materials. The carriers may be, for example, a leadframe or a part of a leadframe. Furthermore, the carriers may be plated with an electrically conductive material, for example, copper, silver, iron nickel or nickel phosphorus. It may also be provided that the carriers are removed from the devices during production of the devices.

The devices may include an encapsulation material, which may be electrically insulating. The encapsulation material may cover any fraction of any number of surfaces of the components of the device. The encapsulation material may serve various functions. It may be used, for example, to electrically insulate components of the device from each other and/or from external components, but the encapsulation material may also be used as a platform to mount other components, for example, wiring layers. The encapsulation material may be used to produce fan-out type packages. In a fan-out type package at least some of the external contact elements and/or conductor tracks connecting the semiconductor chip to the external contact elements are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

The encapsulation material may be deposited on the components of the device using various techniques. For example, the encapsulation material may be deposited by printing or from a gas phase or a solution or by using any other appropriate method. The encapsulation material may, for example, contain silicone material or may entirely consist of silicone (or polymerized siloxanes or polysiloxanes). The encapsulation material may have an elastic modulus of, for example, less than 100 MPa. The encapsulation material may be thermally conducting so that it can dissipate the heat generated by the semiconductor chips. It may also be provided that the devices contain encapsulation material that is thermally insulating.

Furthermore, the encapsulation material may be any appropriate duroplastic, thermoplastic or thermosetting material or laminate (prepreg) and may contain filler materials. This kind of encapsulation material may be deposited, for example, by compression molding, injection molding, powder molding, potting, dispensing, jetting or lamination.

One or more through-holes may be created in the encapsulation material. The through-holes may, for example, expose portions of a metal layer to allow electrical connection to be made to the metal layer from outside the device. The through-holes may be large enough to receive solder balls or solder deposits. This may be used for stacking devices on top of each other. The through-holes may, for example, be produced by laser ablation, etching, photo-lithographic structuring, mechanical drilling or any other suitable process known to a person skilled in the art.

The devices described below include external contact elements, which may be of any shape, size and material. The external contact elements may be accessible from outside the device and may thus allow electrical contact to be made with the semiconductor chips from outside the device. Furthermore, the external contact elements may be thermally conducting and may serve as heat sinks for dissipating the heat generated by the semiconductor chips. The external contact elements may be composed of any desired electrically conducting material. The external contact elements may include external contact pads. Solder material may be deposited on the external contact pads. The solder material may have the shape of solder balls and may, for example, be composed of SnPb, SnAg, SnAgCu, SnAgCuNi, SnAu, SnCu and/or SnBi.

Figure 1:
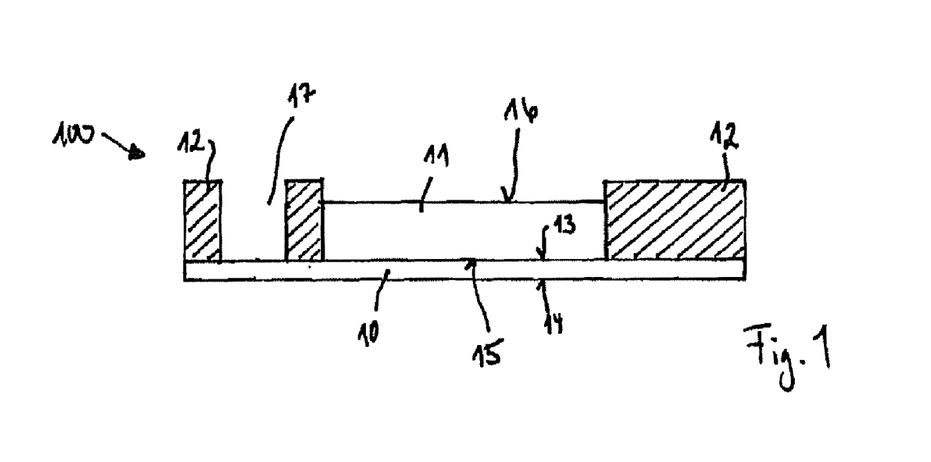
FIG. 1 schematically illustrates a cross-sectional view of one embodiment of a device including a semiconductor chip, an encapsulation material and a through-hole through the encapsulation material.

FIG. 1 schematically illustrates a cross-sectional view of a device 100. The device 100 includes a metal layer 10, a semiconductor chip 11 and an encapsulation material 12. The metal layer 10 has a first face 13 and a second face 14 opposite to the first 13. The semiconductor chip 11 has a first face 15 and a second face 16 opposite to the first face 15. The semiconductor chip 11 is placed over the metal layer 10 with its first face 15 facing the first face 13 of the metal layer 10. Furthermore, the semiconductor chip 11 is electrically coupled to the metal layer 10. The encapsulation material 12 covers the first face 13 of the metal layer 10 and the semiconductor chip 11. At least one through-hole 17 extends from the first face 13 of the metal layer 10 through the encapsulation material 12. The through-hole 17 is unfilled or at least not completely filled with a material so that the through-hole 17 is accessible from outside the device 100. Furthermore, the portion of the first face 13 of the metal layer 10, which is exposed by the through-hole 17, is accessible from outside the device 100.

Figure 2:
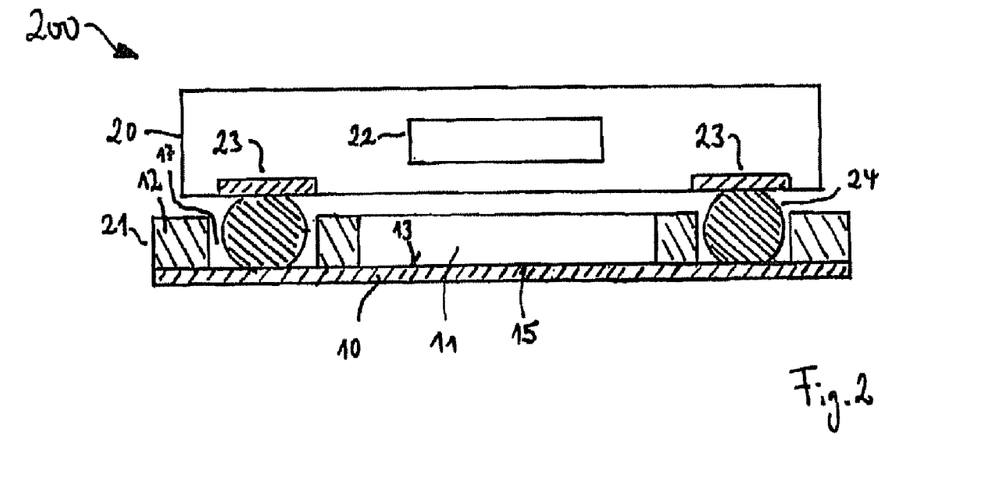
FIG. 2 schematically illustrates a cross-sectional view of one embodiment of a module including two devices stacked on top of each other.

FIG. 2 schematically illustrates a cross-sectional view of a module 200. The module 200 consists of a first device 20 and a second device 21. The first device 20 includes a first semiconductor chip 22 and a plurality of first external contact pads 23 electrically coupled to the first semiconductor chip 22. The second device 21 includes a metal layer 10 having a first face 13 and a second semiconductor chip 11 having a first face 15. The second semiconductor chip 11 is attached to the metal layer 10 with its first face 15 facing the first face 13 of the metal layer 10. The second device 21 further includes an encapsulation material 12 covering the first face 13 of the metal layer 10 and the semiconductor chip 11. A plurality of through-holes 17 extend from the first face 13 of the metal layer 10 through the encapsulation material 12. The module 200 further contains a plurality of solder bumps 24 electrically coupling the metal layer 10 to the first external contact pads 23, wherein each of the solder bumps 24 is placed at least partially in a respective one of the through-holes 17.

Figure 3A:
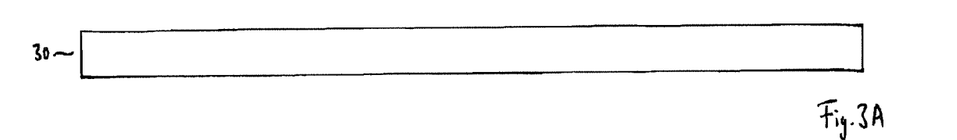
FIGS. 3A to 3M schematically illustrate a cross-sectional view of one embodiment of a method of manufacturing a device including a carrier, a semiconductor chip, an encapsulation material and a through-hole through the encapsulation material.
Figure 3B:
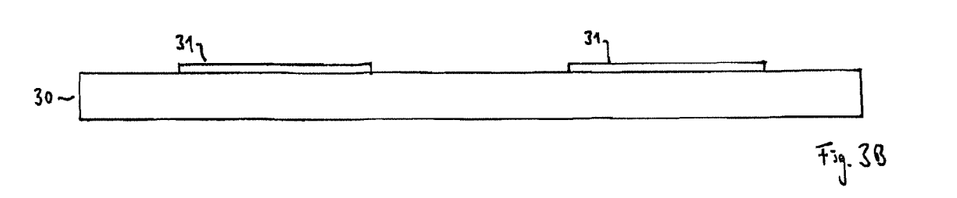
Figure 3C:
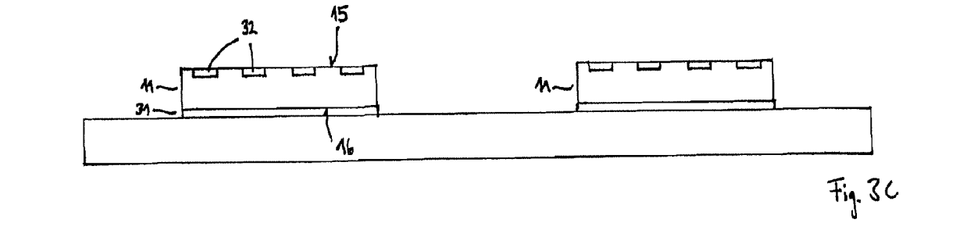
Figure 3D:
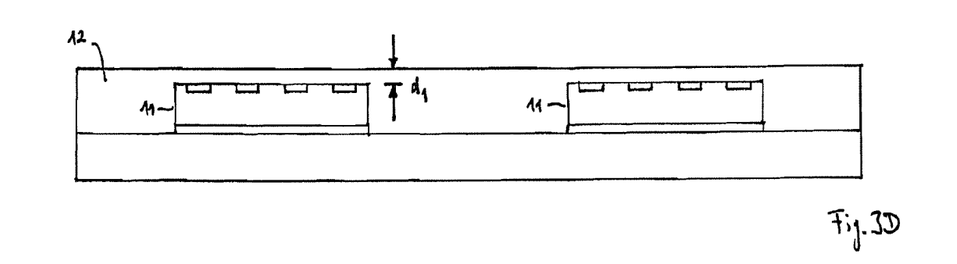
Figure 3E:
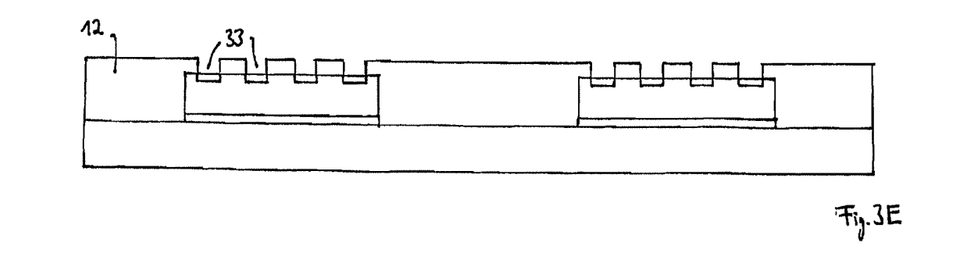
Figure 3F:
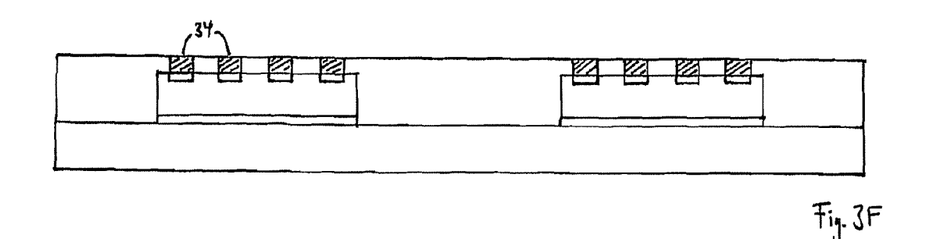
Figure 3G:
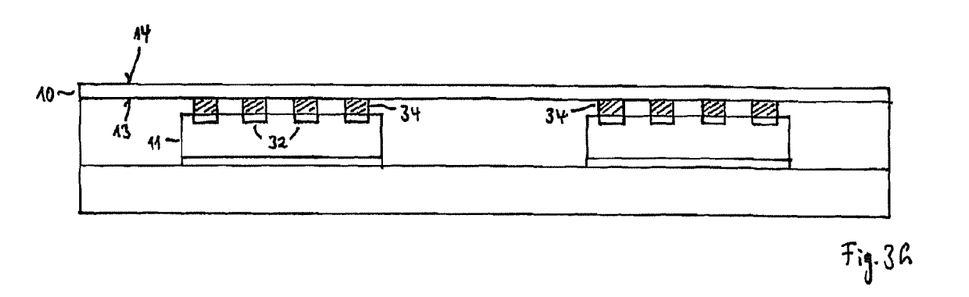
Figure 3H:
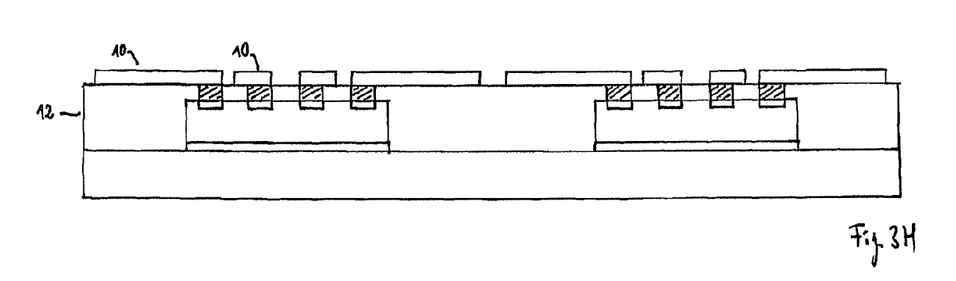
Figure 3I:
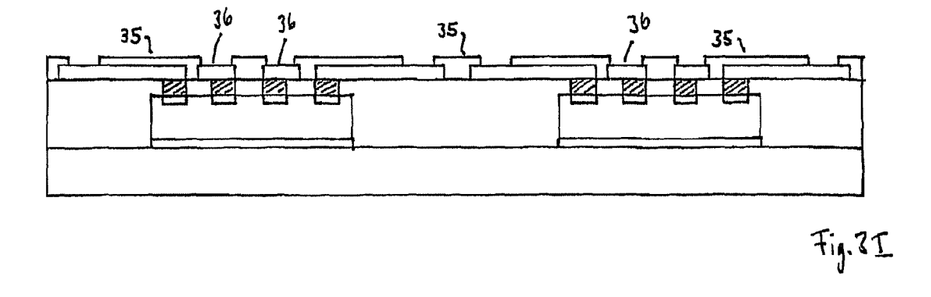
Figure 3J:
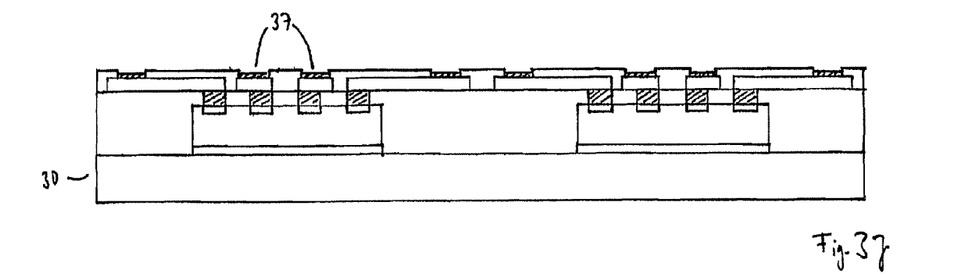
Figure 3K:
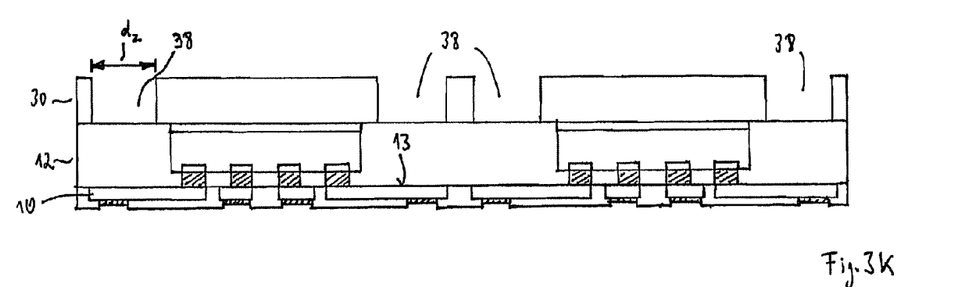
Figure 3L:
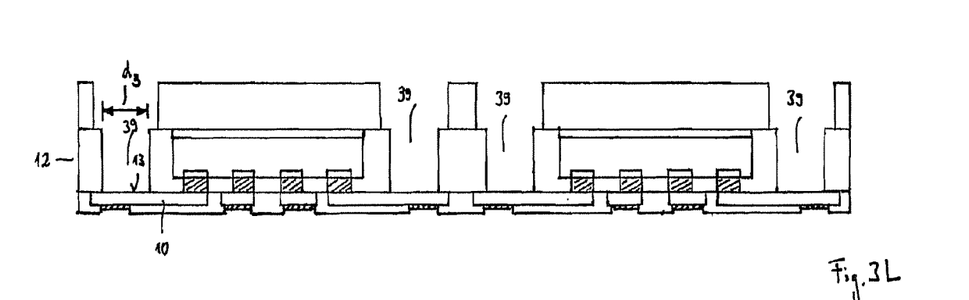
Figure 3M:
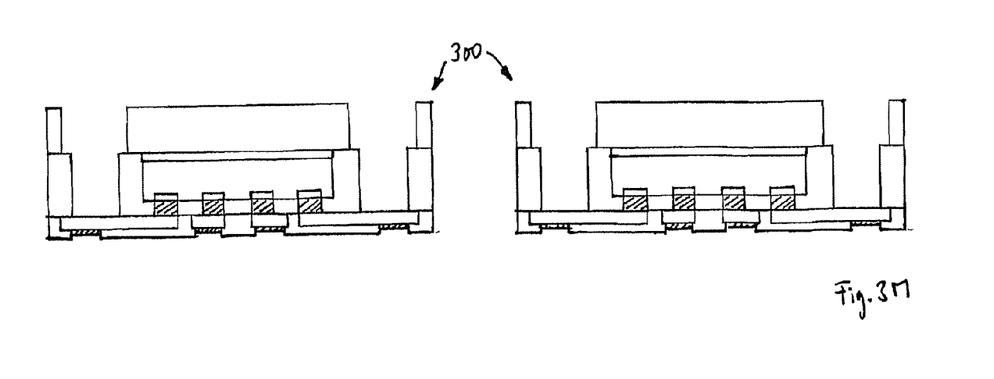

FIGS. 3A to 3M schematically illustrate a cross-sectional view of one embodiment of a method of manufacturing a device 300, which is illustrated in FIG. 3M. The device 300 is an implementation of the device 100 illustrated in FIG. 1. The details of the device 300 that are described below can therefore be likewise applied to the device 100. Similar or identical components of the devices 100 and 300 are denoted by the same reference numerals.

As illustrated in FIG. 3A, a carrier 30 is provided. The carrier 30 may be a plate or a foil made of a rigid material, for example, a metal or a metal alloy, such as copper, aluminum, nickel, CuFeP, steel or stainless steel. The carrier 30 may have a flat upper surface on which the semiconductor chips 11 are placed later on. The shape of the carrier 30 is not limited to any geometric shape, and the carrier 30 may have any appropriate size. For example, the thickness of the carrier 30 may be in the range from 50 µm to 1 mm. Furthermore, the carrier 30 may be structured. The carrier 30 may be, for example, a leadframe or a part of a leadframe. Moreover, the carrier 30 may be plated with an electrically conductive material, for example, copper, silver, iron nickel or nickel phosphorus.

A material 31, for example, an adhesive material, may be deposited on the upper surface of the carrier 30 as illustrated in FIG. 3B. The adhesive material 31 may be made of a polymer or any other suitable material. The adhesive material 31 may contain silicone, i.e. polymerized siloxanes or polysiloxanes, or fluorinated silicone or may be entirely made of silicone. The adhesive material 31 may further be a mixture of silicone and epoxy resin or a mixture of silicone and polyimide. After hardening, the adhesive material 31 may have an elastic modulus of less than 100 MPa, less than 50 MPa or 20 MPa or 10 MPa or 5 MPa or 2 MPa or 1 MPa or 500 kPa or 200 kPa or 100 kPa or 50 kPa or 20 kPa. The elastic modulus is also known as the Young's modulus, modulus of elasticity or tensile modulus. The elastic modulus may be defined as the ratio of stress, which has units of pressure, to strain, which is dimensionless; therefore the elastic modulus itself has units of pressure.

The elastic modulus of the adhesive material 31 as described above may allow a floating mounting of the semiconductor chips 11. Due to the different thermal expansion coefficients of the carrier 30 and the semiconductor chips 11, a floating mounting of the semiconductor chip 11 is desired to reduce the mechanical stress induced during temperature cycles. As an example, copper of which the carrier 30 may be manufactured has a thermal expansion coefficient of about $17 \times 10^{-6}$/K and silicon of which the semiconductor chips 11 may be manufactured has a thermal expansion coefficient of about $3 \times 10^{-6}$/K.

The adhesive material 31 may have a thermal conductivity, for example, in the range between 0.1 W/mK and 5 W/mK or higher. Alternatively, the adhesive material 31 may be thermally insulating. The adhesive material 31 may exhibit low outgassing during cure and high thixotropy. Elastosil may be used for the adhesive material 31, for example, Elastosil RT705, which is commercially available.

The adhesive material 31 may be deposited at those places of the upper surface of the carrier 30 where the semiconductor chips 11 are placed later on. When deposited the adhesive material 31 may be fluid, viscous or waxy. The deposition of the adhesive material 31 may, for example, be performed by stencil printing, screen printing, dispensing or any other appropriate method.

As illustrated in FIG. 3C, two semiconductor chips 11 as well as possibly further semiconductor chips are placed over the islands of the adhesive material 31 deposited on the carrier 30. Although the islands of the adhesive material 31 and the semiconductor chips 11 have the same surface areas in FIG. 3C, their surface areas may be different. The semiconductor chips 11 may be arranged in an array. Furthermore, any suitable array of semiconductor chips 11 may be placed on the carrier 30 (only two of the semiconductor chips 11 are illustrated in FIG. 3C). For example, more than 50 or 500 or 1000 semiconductor chips 11 may be placed on the carrier 30. The semiconductor chips 11 are relocated on the carrier 30 in larger spacing as they have been in the wafer bond. The semiconductor chips 11 may have been manufactured on the same semiconductor wafer, but may alternatively have been manufactured on different wafers. Furthermore, the semiconductor chips 11 may be physically identical, but may also contain different integrated circuits and/or represent other components and/or may have different outer dimensions and/or geometries. The semiconductor chips 11 may have a thickness in the range between 50 µm and several hundred micrometers. The semiconductor chips 11 may be placed on the carrier 30 with their first faces 15 facing away from the carrier 30 and their second faces 16 opposite to the first faces 15 facing the carrier 30. The first and second faces 15, 16 may be main faces of the semiconductor chips 11. The first faces 15 may be active main faces 15 of the semiconductor chips 11, on which contact pads 32 may be located. The integrated circuits embedded in the semiconductor chips 11 can be electrically accessed via the contact pads 32, which may be made of a metal, for example, aluminum or copper.

A pick-and-place tool may be used capable of picking the semiconductor chips 11 and placing them on the adhesive material 31. The semiconductor chips 11 may be pressed in the adhesive material 31.

After the placement of the semiconductor chips 11, the adhesive material 31 may be cured (hardened) by a heat treatment at moderate temperatures, for example, temperatures of less than 200° C. or 140° C. or 100° C. for several minutes. The heat treatment may be performed by using a hot plate or an oven.

Photo imaging may be performed to store the positions and angles of the semiconductor chips 11 placed on the carrier 30. Depending on the accuracy of the positioning system used to place the semiconductor chips 11, photo imaging may not be necessary.

Before the deposition of the encapsulation material 12 a leveling process may be performed to align the first faces 15 of the semiconductor chips 11. For that, a further carrier, for example, a wafer, may be pressed onto the semiconductor chips 11. The leveling process may be performed before or after the adhesive material 31 is hardened.

As illustrated in FIG. 3D, the encapsulation material 12 is deposited on the semiconductor chips 11 and the exposed surfaces of the carrier 30. The gaps between the semiconductor chips 11 are also filled with the encapsulation material 12. The height $d_1$ of the encapsulation material 12 above the first faces 15 of the semiconductor chips 11 may be at least 10 µm and around 30 µm. After its deposition the encapsulation material 12 may provide planar sections on its upper surface, which are coplanar to the upper surface of the carrier 30. These planar surfaces may be used to mount other components, such as a redistribution layer.

The encapsulation material 12 used for covering the semiconductor chips 11 may be electrically insulating and made of a polymer or any other suitable material. The encapsulation material 12 may contain silicone or fluorinated silicone or may be entirely made of silicone. The encapsulation material 12 may further be a mixture of silicone and epoxy resin or a mixture of silicone and polyimide. After hardening, the encapsulation material 12 may have an elastic modulus of less than 100 MPa, less than 50 MPa or 20 MPa or 10 MPa or 5 MPa or 2 MPa or 1 MPa or 500 kPa or 200 kPa or 100 kPa or 50 kPa or 20 kPa. Its elastic modulus may be around 3 MPa.

The encapsulation material 12 may have a thermal conductivity, for example, in the range between 0.1 W/mK and 5 W/mK or higher. The encapsulation material 12 may exhibit low outgassing during cure and low thixotropy. Elastosil may be used for the encapsulation material 12 though being highly thixotropic, for example, Elastosil RT705, which is commercially available.

The elastic modulus of the encapsulation material 12 as described above may allow a floating mounting of the semiconductor chips 11 with respect to the metal foil 10 which is placed over the semiconductor chips 11 later on. Due to the different thermal expansion coefficients of the semiconductor chips 11 and the metal foil 10, floating mounting of the semiconductor chip 11 is desired to reduce the mechanical stress induced during temperature cycles.

During its deposition the encapsulation material 12 may be fluid, viscous or waxy. The deposition of the encapsulation material 12 may, for example, be performed by stencil printing, screen printing, dispensing or any other appropriate method.

After its deposition, the encapsulation material 12 may be semi-cured (partially hardened) by a heat treatment at moderate temperatures, for example, temperatures of less than 120° C. or 100° C. or 80° C. for several minutes. The heat treatment may be performed by using a hot plate or an oven.

The encapsulation material 12 may be structured to create cut-outs or through-holes 33 reaching from the upper surface of the encapsulation material 12 down to the contact pads 32 of the semiconductor chips 11 as illustrated in FIG. 3E. The aspect ratio of the through-holes 33, which is the ratio of the height to the width of the through-holes 33, may depend on the method used to fill the through-holes 33 with electrically conductive material. The encapsulation material 12 may, for example, be structured by laser ablation. It may be provided that the diameter of the through-holes 33 is not larger than 50 μm if laser structuring is employed. Laser structuring may be used in one embodiment if the accuracy of the positioning system used to place the semiconductor chips 11 is low, and photo imaging has been performed to store the positions and angles of the semiconductor chips 11 placed on the carrier 30. Other techniques to create the through-holes 33 are chemical etching or photo-lithographic structuring if the encapsulation material 12 contains a photo-sensitive component. A further alternative is to use a printing technology for the deposition of the encapsulation material 12, such as stencil printing or screen printing, and to leave at least portions of the contact pads 32 exposed when printing the encapsulation material 12 on the carrier 30 and the semiconductor chips 11.

Solder material 34 may be placed in the through-holes 33 as illustrated in FIG. 3F. The solder material 34 may be applied by using stencil printing or other suitable printing methods. In another embodiment, pre-shaped solder balls having diameters not larger than the diameters of the through-holes 33 may be inserted into the through-holes 33 by brushing or rolling. Furthermore, the solder material 34 or any other electrically conductive material may be filled into the through-holes 33 by using pressure to fill the material in liquid state into the through-holes 33. It may be provided that the solder material 34 protrudes from the upper surface of the encapsulation material 12 meaning that the solder material 34 deposited in the through-holes 33 has a height larger than the height $d_1$. The solder material 34 may be made of metal alloys which are composed, for example, from the following materials: SnPb, SnAg, SnAgCu, SnAgCuNi, SnAu, SnCu and SnBi. The solder material 34 may contain flux material which exhibits low outgassing. The contact pads 32 of the semiconductor chips 11 may have a solderable surface.

As an alternative to the solder material 34, other electrically conductive materials, such as electrically conductive glue or metal (nano-)particles, may be deposited in the through-holes 33. The metal particles may, for example, be made of a metal, such as silver, gold, copper, tin or nickel. The extensions (average diameter) of the metal particles may be smaller than 100 nm and, in one embodiment, smaller than 50 nm or 10 nm. It may also be provided that only a fraction of the metal particles has such dimensions. For example, at least 10% or 20% or 30% or 40% or 50% or 60% or 70% of the metal particles may have dimensions smaller than 100 nm or 50 nm or 10 nm. The other metal particles may have larger dimensions.

On top of the encapsulation material 12 a redistribution layer may be produced. One possibility to produce the redistribution layer is to use a standard PCB (printed circuit board) industry process flow. As illustrated in FIG. 3G, a metal layer 10, for example, a metal foil, may be applied with its first face 13 to the upper surface of the encapsulation layer 12. The metal foil 10 may be made of copper, aluminum or any other metal, metal alloy or metal stack. The metal foil 10 may be solderable so that it does not completely dissolve at locations where a solder process is performed. The thickness of the metal foil 10, for example, a copper foil, may be in the range between 6 and 500 μm and in the range between 8 and 200 μm. The metal layer 10 may also consists of stacked metal layers. For example, a copper layer, a nickel layer and another copper layer may be stacked on top of each other. Each of the three layers may have a thickness of at least 1 μm. The reduced thickness of the stacked metal layers when compared to a foil made of, for example, pure copper may be due to the lower solubility of nickel by solder material. Instead of the nickel layer other metal layers may be used that have a lower solubility in solder material than copper.

The metal foil 10 may be laminated onto the underlying structures by applying vacuum and pressure for a time suitable to adhere the metal foil 10 to the encapsulation material 12. Furthermore, heat may be applied during the lamination of the metal foil 10. After the lamination of the metal foil 10 heat and pressure may be applied to melt the solder material 34 embedded in the encapsulation material 12. The temperature may be in the range between 200 and 400° C. By melting the solder material 34, a soldering process is initiated which produces soldered joints between the contact pads 32 of the semiconductor chips 11 and the metal foil 10. Due to the heat applied during the soldering process, the encapsulation material 12 may be cured and may connect firmly with the metal foil 10. The metal foil 10 may be perforated to allow outgassing of the encapsulation material 12 and the solder material 34 during cure.

If electrically conductive glue is deposited in the through-holes 33 instead of the solder material 34, a temperature higher than, for example, 150° C. may be applied in order to cure the glue. If metal (nano-)particles are deposited in the through-holes 33, a temperature high enough to sinter the metal particles may be applied. The temperature may, for example, be higher than 150 or 200° C. and depends on the diameter of the metal particles.

On top of the metal foil 10, a dry resist film may be laminated, which is photostructurable. Recesses may be formed in the resist film by exposure to light having a suitable wavelength. For that, a laser beam and the data recorded during the photo imaging may be used. If the accuracy of the positioning system used to place the semiconductor chips 11 is high enough, the resist film may be selectively exposed to the light of the suitable wave-length emitted through a mask. Subsequently, the resist film is developed and the thereby exposed portions of the metal foil 10 are etched. Afterwards the resist film is stripped off, and only the structured metal foil 10 remains on the encapsulation material 12 as illustrated in FIG. 3H.

A layer 35, which may consist of a silicone material and a ductile electrically insulating material, may be applied to the structured metal foil 10 and the exposed portions of the encapsulation material 12 as illustrated in FIG. 3I. The layer 35 may be electrically insulating and thermally conductive. For example, the layer 35 may have a thickness of about 20 μm. The layer 35 may, for example, be stencil printed or screen printed leaving external contact pads 36 open at appropriate locations. The layer 35 may be cured and cleaned afterwards. Moreover, prior to the deposition of the layer 35 a further layer may be deposited from the gas phase, for example, by sputtering. The further layer may consist of amorphous carbon, for example, HDMC, or ceramic material. The layer 35 may prevent solder material from bridging between conductor tracks and creating short circuits. The layer 35 also provides protection from the environment.

The layer 35 may be photostructurable. By exposure to light having a suitable wave-length and subsequent development, recesses may be formed in the layer 35 to expose the external contact pads 36.

Solder material 37 may be applied onto the surfaces of the external contact pads 36 exposed from the layer 35 as illustrated in FIG. 3J. The solder material 37 may be applied by printing, for example, stencil printing, followed by a heat-treatment process to melt the solder material 37. The solder material may, for example, be composed of SnPb, SnAg, SnAgCu, SnAgCuNi, SnAu, SnCu and/or SnBi. The external contact pads 36 and the solder material 37 may be used as external contact elements later on to electrically couple the devices 300 to other components, for example, a PCB. The external contact pads 36 may be laterally shifted from the contact pads 32 of the semiconductor chips 11. Prior to the application of the solder material 37, the external contact pads 36 may be cleaned, for example, by RIE (reactive ion etching) or chemical cleaning, in order to remove solder stop material and/or embedded material remained on the external contact pads 36. Instead of the solder material 37, other materials, for example, NiAu, may be applied onto the surfaces of the external contact pads 36, which prevent oxidation of the external contact pads 36.

Before or after the application of the solder material 37, through-holes 38 extending through the carrier 30 may be created as illustrated in FIG. 3K. The through-holes 38 may be essentially orthogonal to the first face 13 of the metal foil 10. The through-holes 38 expose portions of the encapsulation material 12. The diameter $d_2$ of the through-holes 38 is not necessarily uniform and may be in the range from 200 to 800 μm, the diameter $d_2$ may be larger than 210 or 220 or 230 or 240 or 250 or 260 or 270 or 280 or 290 or 300 μm. The cross section of the through-holes 38 (parallel to the first face 13 of the metal foil 10) may have any appropriate shape, for example, it may be circular-, rectangular- or square-shaped. The cross section of each of the through-holes 38 may have an area of at least $3.0 \times 10^4$ or $3.2 \times 10^4$ or $3.4 \times 10^4$ or $3.6 \times 10^4$ or $3.8 \times 4$ or $4.0 \times 10^4$ or $4.5 \times 10^4$ or $5.0 \times 10^4$ or $5.5 \times 10^4$ or $6.0 \times 10^4$ or $6.5 \times 10^4$ or $7.0 \times 10^4$ μm². The cross sections of the through-holes 38 may be large enough to receive solder bumps, for example, solder balls, later on.

The carrier 30 may be structured by any appropriate method in order to produce the through-holes 38, for example, by etching, a stamping process, laser ablation, mechanical drilling. For example, a dry photostructurable resist film may be laminated on top of the carrier 30. Recesses may be formed in the resist film by exposure to light having a suitable wave-length. For that, a laser beam may be used, or the resist film may be selectively exposed to the light of the suitable wave-length emitted through a mask. Subsequently, the resist film is developed and the thereby exposed portions of the carrier 30 are etched. Afterwards the resist film is stripped off, and only the structured carrier 30 remains as illustrated in FIG. 3K. The redistribution layer may be protected during the etching process, for example, by performing the etching process only on one side of the device 300.

Through-holes 39 may be produced in the encapsulation material 12 at places where the encapsulation material 12 has been exposed by the through-holes 38 as illustrated in FIG. 3L. The through-holes 39 may be, for example, essentially orthogonal to the first face 13 of the metal foil 10 and may expose portions of the first face 13 of the metal foil 10. The diameter $d_3$ of the through-holes 39 is not necessarily uniform and may be in the range from 200 to 800 μm, the diameter $d_3$ may be larger than 210 or 220 or 230 or 240 or 250 or 260 or 270 or 280 or 290 or 300 μm. The cross section of the through-holes 39 (parallel to the first face 13 of the metal foil 10) may have any appropriate shape, for example, it may be circular-, rectangular- or square-shaped. The cross section of each of the through-holes 39 may have an area of at least $3.0 \times 10^4$ or $3.2 \times 10^4$ or $3.4 \times 10^4$ or $3.6 \times 10^4$ or $3.8 \times 10^4$ or $4.0 \times 10^4$ or $4.5 \times 10^4$ or $5.0 \times 10^4$ or $5.5 \times 10^4$ or $6.0 \times 10^4$ or $6.5 \times 10^4$ or $7.0 \times 10^4$ μm². The cross sections of the through-holes 39 may be large enough to receive solder bumps, for example, solder balls, later on.

The through-holes 39 may be produced by a laser beam or any other appropriate method. In case of laser ablation, the laser ablation process may be stopped by the metal foil 10. After the production of the through-holes 38 and 39, the thereby exposed portions of the first face 13 of the metal foil 10 may be cleaned, for example, by using RIE or chemical cleaning, in order to remove embedded material remained on the exposed portions of the metal foil 10.

The diameter $d_2$ of the through-holes 38 may be equal to the diameter $d_3$ of the through-holes 39, or the diameter $d_2$ may be larger than the diameter $d_3$. In the latter case, each of the through-holes 39 may be centered with respect to the respective through-hole 38. The larger diameter $d_2$ of the through-holes 38 may prevent solder material to come into contact with the electrically conductive carrier 30 once solder bumps are placed in the through-holes 38, 39. Such a short circuit may also be prevented by coating the through-holes 38 and/or 39 with an electrically insulating solder stop layer. In general, the through-holes 38, 39 are unfilled or at least not completely filled so that exposed portions of the first face 13 of the metal foil 10 are accessible from outside the device 300.

As illustrated in FIG. 3M, the devices 300 are separated from one another by separation of the carrier 30, the encapsulation material 12 and the redistribution layer, for example, by sawing, cutting, laser ablation or etching.

The devices 300 manufactured by the method described above are fan-out type packages. The encapsulation material 12 allows the redistribution layer to extend beyond the outline of the semiconductor chip 11. The external contact elements 36, 37 therefore do not need to be arranged within the outline of the semiconductor chip 11 but can be distributed over a larger area. The increased area which is available for arrangement of the external contact elements 36, 37 as a result of the encapsulation material 12 means that the external contact elements 36, 37 cannot only be arranged at a great distance from one another, but that the maximum number of external contact elements 36, 37 which can be arranged there is likewise increased compared to the situation when all the external contact elements 36, 37 are arranged within the outline of the semiconductor chip 11.

It is obvious to a person skilled in the art that the devices 300 illustrated in FIG. 3M and the manufacturing thereof as described above are only intended to be an exemplary embodiment, and many variations are possible. For example, further semiconductor chips or passives of different types may be included in the same device 300. The semiconductor chips and passives may differ in function, size, manufacturing technology etc. Moreover, the redistribution layer may include more than one metal layer.

In the embodiment described above and illustrated in FIGS. 3A to 3M, the solder material 34 deposited in the through-holes 33 is melted after the lamination of the metal foil 10. The solder material 34 may be melted when the solder material 37 deposited on the external contact pads 36 is melted, i.e. after the deposition of the solder material 34 its melting temperature is not reached until the solder material 37 is melted. If electrically conductive glue or metal particles are used instead of the solder material 34, the electrically conductive glue is cured or the metal particles are sintered when the solder material 37 is melted.

According to one embodiment, the encapsulation material 12 deposited on top of the semiconductor chips 11 may be different from the encapsulation material 12 deposited on the exposed portions of the carrier 30 and covering the side faces of the semiconductor chips 11. The two encapsulation materials 12 may, for example, differ in terms of their elastic modulus and/or thermal conductivity and/or thixotropy.

According to one embodiment, the encapsulation material 12 may be deposited using two deposition processes. In a first process, the encapsulation material 12 is deposited on the exposed parts of the carrier 30 such that the upper surface of the encapsulation material 12 and the first faces 15 of the semiconductor chips 11 form an essentially common plane. In a second process, a layer of the encapsulation material 12 having a thickness $d_1$ is deposited on the previously deposited encapsulation material 12 and the semiconductor chips 11. In another embodiment, in the first process, the encapsulation material 12 is deposited on the exposed parts of the carrier 30 such that the encapsulation material 12 is higher than the semiconductor chips 11 for about the height $d_1$. In the second process, the encapsulation material 12 is only deposited on the first faces 15 of the semiconductor chips 11.

According to one embodiment, after the deposition of the encapsulation material 12, no through-holes 33 are created in the encapsulation material 12 as illustrated in FIG. 3E, but the metal foil 10 is laminated on the upper surface of the encapsulation material 12 and is structured. After the structuring of the metal foil 10, the encapsulation material 12 may be structured to create the through-holes 33. Afterwards, the solder material 34 may be placed in the through-holes 33 and may be melted in order to create an electrical connection between the contact pads 32 of the semiconductor chips 11 and the metal foil 10. As an alternative to the solder material 34, electrically conductive adhesive material may be placed in the through-holes 33. Furthermore, nanopastes, which consist of metal particles, such as copper or silver, having dimensions in the nanometer range, may be used instead of the solder material 34. During application the metal particles may be dispersed in a solvent which evaporates later on. The metal particles are sintered to create electrically conductive connections.

According to one embodiment, after the manufacturing of the through-holes 33 as illustrated in FIG. 3E an electrically conductive material is deposited in the through-holes 33 and on the upper surface of the encapsulation material 12 thereby forming a redistribution layer. The electrically conductive material may not completely fill the through-holes 33, but only coat the walls of the through-holes 33. The electrically conductive material may be produced by electroless and/or galvanic plating processes. Thereby a seed layer is first electroless deposited onto the upper surface of the encapsulation material 12 and the exposed regions of the contact elements 32. Materials such as palladium or titanium may be used for the seed layer which usually has a thickness of less than 1 μm. The thickness of the seed layer may be increased by depositing a further layer of an electrically conductive material onto the seed layer. For example, a layer of copper may be electroless deposited onto the seed layer. This copper layer may have a thickness of less than 1 μm. Afterwards another layer of copper may be galvanically deposited, which may have a thickness of more than 5 μm. The electroless copper deposition may also be omitted.

According to one embodiment, the encapsulation material 12 is applied to the carrier 30 before the semiconductor chips 11 are placed over the carrier 30. In this case, the semiconductor chips 11 are pressed into the encapsulation material 12.

Figure 4A:
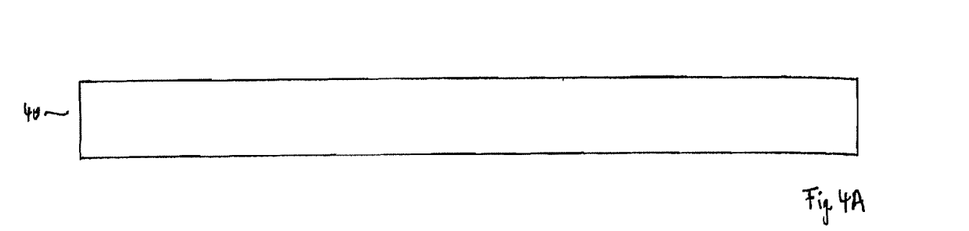
FIGS. 4A to 4K schematically illustrate a cross-sectional view of one embodiment of a method of manufacturing a device including a semiconductor chip, an encapsulation material and a through-hole through the encapsulation material.
Figure 4B:
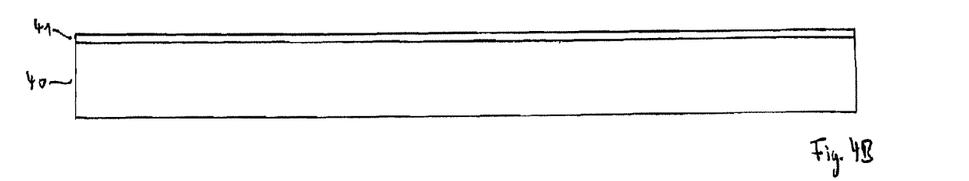
Figure 4C:
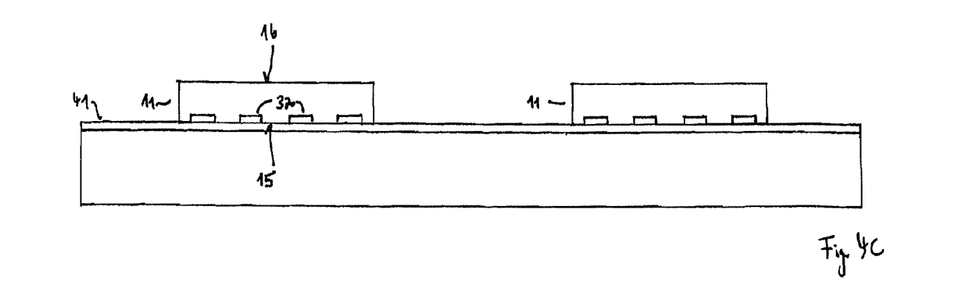
Figure 4D:
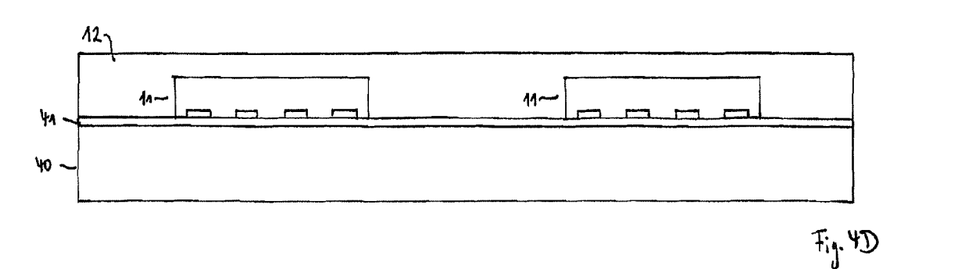
Figure 4E:
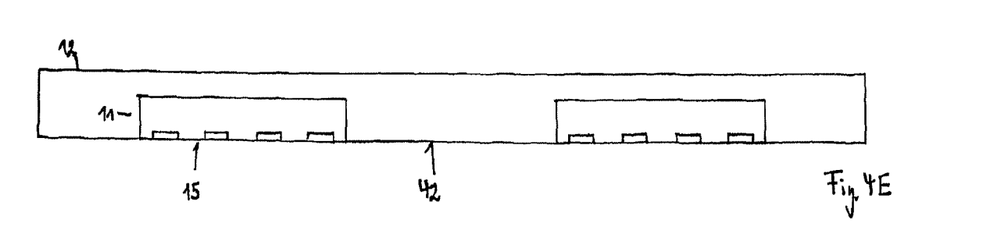
Figure 4F:
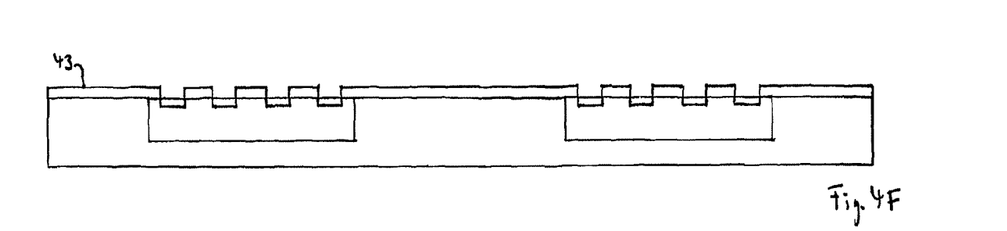
Figure 4G:
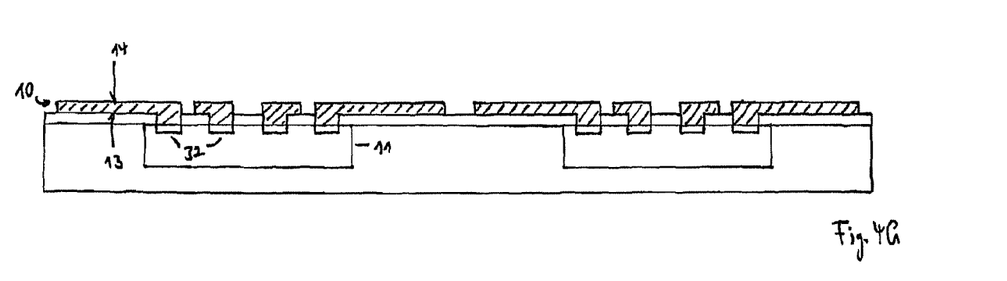
Figure 4H:
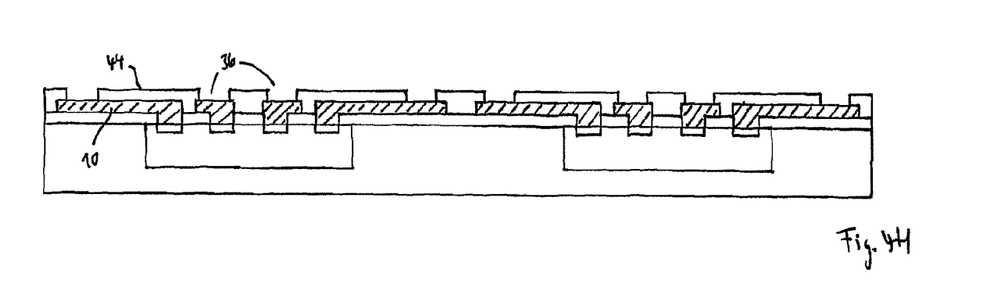
Figure 4I:
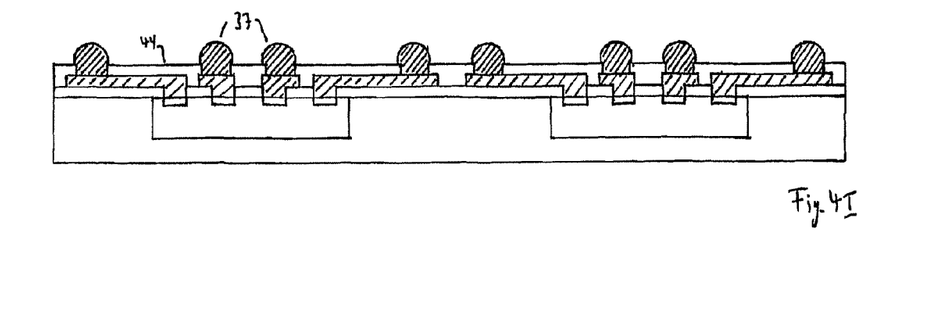
Figures 4J, 4K:
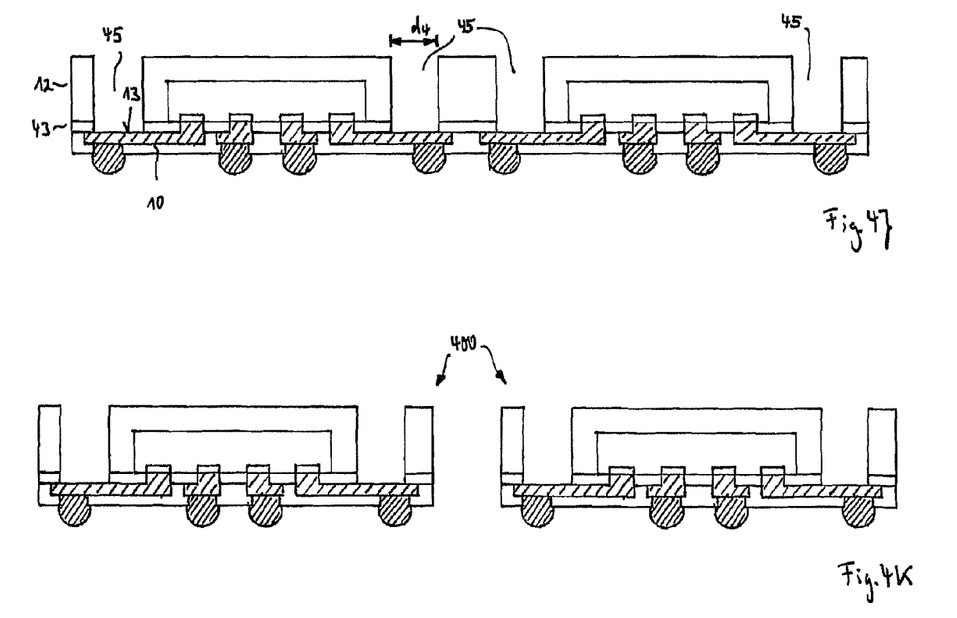

FIGS. 4A to 4K schematically illustrate a cross-sectional view of one embodiment of a method of manufacturing a device 400, which is illustrated in FIG. 4K. The device 400 is an implementation of the device 100 illustrated in FIG. 1. The details of the device 400 that are described below can therefore be likewise applied to the device 100. Similar or identical components of the devices 100 and 400 are denoted by the same reference numerals.

In order to manufacture the device 400, a carrier 40 is provided as illustrated in FIG. 4A. The carrier 40 may be a plate made of a rigid material, for example, a metal, such as nickel, steel or stainless steel, laminate, film or a material stack. The carrier 40 may have at least one flat surface on which components of the device 400 can be placed. The shape of the carrier 40 is not limited to any geometric shape, for example, the carrier 40 may be round or square-shaped. The carrier 40 may have any appropriate size. An adhesive tape 41, for example, a double sided sticky tape, may be laminated onto the carrier 40 as illustrated in FIG. 4B.

As illustrated in FIG. 4C, two or more semiconductor chips 11 are placed over the carrier 40. The semiconductor chips 11 can be fixed on the adhesive tape 41 with the first faces 15 of the semiconductor chips 11 facing the carrier 40. Contact pads 32 may be arranged on the first faces 15 of the semiconductor chips 11.

The semiconductor chips 11 are relocated on the carrier 40 in larger spacing as they have been in the wafer bond. The semiconductor chips 11 may be physically identical, but may also contain different integrated circuits and/or represent other components.

After the semiconductor chips 11 have been mounted on the carrier 40, the semiconductor chips 11 are covered with an encapsulation material 12 as illustrated in FIG. 4D. For example, the encapsulation material 12 may be a duroplastic or thermosetting mold material. The gaps between the semiconductor chips 11 are also filled with the encapsulation material 12. The encapsulation material 12 may be based on an epoxy material and may contain a filling material consisting of small particles of glass ($SiO_2$) or other electrically insulating mineral filler materials like $Al_2O_3$ or organic filler materials. Compression molding, injection molding, powder molding or other appropriate molding techniques or other casting techniques may be employed to apply the encapsulation material 12.

As an alternative to the mold material, another polymer material may be used as the encapsulation material 12 to cover the semiconductor chips 11. The polymer material 12 may have the shape of an electrically insulating foil or sheet, which is laminated on top of the semiconductor chips 11 and the carrier 40. Heat and pressure may be applied for a time suitable to attach the polymer foil or sheet 12 to the underlying structure. The gaps between the semiconductor chips 11 are also filled with the polymer material 12. The polymer material 12 may, for example, be a prepreg (short for preimpregnated fibers) that is a combination of a fiber mat, for example, glass or carbon fibers, and a resin, for example, a duroplastic material. Prepreg materials are usually used to manufacture PCBs (printed circuit boards). Well known prepreg materials that are used in PCB industry and that can be used here as the polymer material 12 are: FR-2, FR-3, FR-4, FR-5, FR-6, G-10, CEM-1, CEM-2, CEM-3, CEM-4 and CEM-5. Prepreg materials are bi-stage materials, which are flexible when applied over the semiconductor chips 11 and hardened during a heat-treatment. For the lamination of the prepreg the same or similar processes can be used as in PCB manufacturing.

The semiconductor chips 11 covered with the encapsulation material 12 are released from the carrier 40, and the adhesive tape 41 is pealed from the semiconductor chips 11 and the encapsulation material 12 as illustrated in FIG. 4E. The adhesive tape 41 may feature thermo-release properties, which allow the removal of the adhesive tape 41 during a heat-treatment. The removal of the adhesive tape 41 from the carrier 40 is carried out at an appropriate temperature, which depends on the thermo-release properties of the adhesive tape 41 and is usually higher than 150° C.

After the release of the carrier 40 and the adhesive tape 41 the first faces 15 of the semiconductor chips 11, which were previously attached to the carrier 40, as well as the bottom surface of the encapsulation material 12 form a common planar surface 42. As illustrated in FIGS. 4F to 4H, a redistribution layer may be applied to the surface 42.

In the present embodiment, the redistribution layer includes a metal layer 10 and dielectric layers 43, 44. The redistribution layer may also include further metal layers and dielectric layers. The dielectric layer 43 is deposited on the planar surface 42 as illustrated in FIG. 4F. The metal layer 10 is applied to the dielectric layer 43, with its first face 13 facing the dielectric layer 43 and electrical contacts being produced to the contact pads 32 of the semiconductor chips 11 as illustrated in FIG. 4G. The dielectric layer 43 has openings in order to produce these electrical contacts. The dielectric layer 44 is subsequently applied to the dielectric layer 43 and the second face 14 of the metal layer 10 as illustrated in FIG. 4H. The dielectric layer 44 is opened in areas where external contact pads 36 are arranged.

The dielectric layers 43, 44 may be fabricated in various ways. For example, the dielectric layers 43, 44 can be deposited from a gas phase or from a solution, or can be laminated onto the underlying structure. Furthermore, thin-film technology methods or a standard PCB industry process flow can be used for application of the dielectric layers 43, 44. Each of the dielectric layers 43, 44 may be up to 10 μm thick. In order to make electrical contacts, the dielectric layers 43, 44 may, for example, be opened by using photolithographic methods and/or etching methods and/or laser techniques.

The metal layer 10 may, for example, be fabricated by metallization followed by structuring of the metallization layer in order to form the conductor tracks of the wiring layer. Any desired metal, for example, aluminum, nickel, palladium, silver, tin, gold or copper, or metal alloy may be used as the material.

The metal layer 10 may also be generated galvanically. For that, usually a seed layer, for example, a palladium layer, is deposited first, which may be carried out electroless or by using an ink jet printing technique. The seed layer can then be used as an electrode for the galvanic deposition of a further electrically conductive layer, for example, a copper layer.

Another technique that may be employed to generate the metal layer 10 is laser direct structuring. In case of laser direct structuring an electrically insulating polymer foil is attached on the desired surface. The circuit definition is done by using a laser beam, which activates special additives in the polymer foil in order to allow subsequent selective plating.

Solder bumps 37, for example, solder balls or solder half-spheres, may be placed onto the external contact pads 36 as illustrated in FIG. 4I. The solder bumps 37 may be applied by ball placement or any other appropriate technique. The dielectric layer 44 may be a solder stop layer that prevents solder from bridging between the conductor tracks and creating short circuits. The dielectric layer 44 also provides protection from the environment.

Before or after the placement of the solder bumps 37, through-holes 45 extending through the encapsulation layer 12 and the dielectric layer 43 may be created as illustrated in FIG. 4J. The through-holes 45 expose portions of the first face 13 of the metal layer 10. The diameter $d_4$ of the through-holes 45 may be in the range from 200 to 800 μm, in one or more embodiments the diameter $d_4$ may be larger than 210 or 220 or 230 or 240 or 250 or 260 or 270 or 280 or 290 or 300 μm. The cross section of the through-holes 45 (parallel to the first face 13 of the metal layer 10) may have any appropriate shape, for example, it may be circular-, rectangular- or square-shaped. The cross section of each of the through-holes 45 may have an area of at least $3.0 \times 10^4$ or $3.2 \times 10^4$ or $3.4 \times 10^4$ or $3.6 \times 10^4$ or $3.8 \times 10^4$ or $4.0 \times 10^4$ or $4.5 \times 10^4$ or $5.0 \times 10^4$ or $5.5 \times 10^4$ or $6.0 \times 10^4$ or $6.5 \times 10^4$ or $7.0 \times 10^4$ μm$^2$. The cross sections of the through-holes 45 may be large enough to receive solder bumps, for example, solder balls, later on. The through-holes 45 may be produced by any appropriate technique, for example, by etching, a stamping process, laser ablation, photo-structuring or mechanical drilling. The exposed portions of the first face 13 of the metal layer 10 may be cleaned, for example, by RIE or chemical cleaning, in order to remove any embedded material remained on these surfaces.

As illustrated in FIG. 4K, the devices 400 are separated from one another by separation of the encapsulation material 12 and the redistribution layer, for example, by sawing, cutting, milling, etching or a laser beam.

Figure 5A:
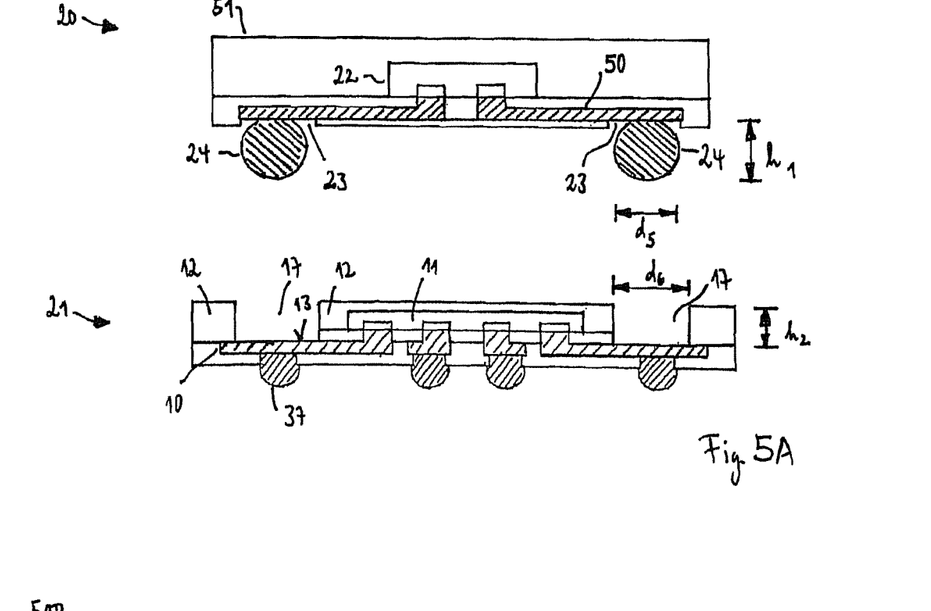
FIGS. 5A to 5C schematically illustrate a cross-sectional view of one embodiment of a method of manufacturing a module including two devices stacked on top of each other and mounting the module on a circuit board.
Figure 5B:
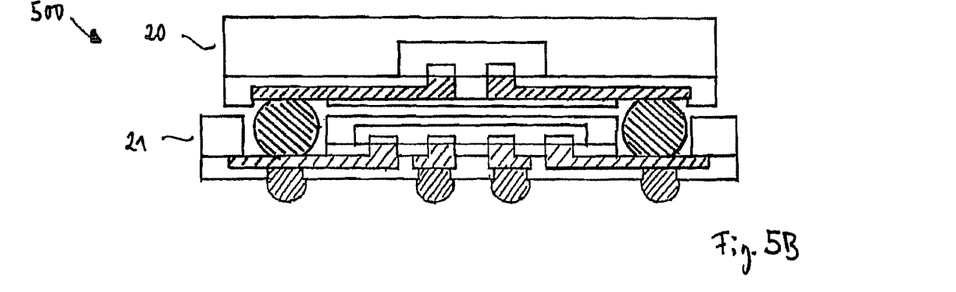
Figure 5C:
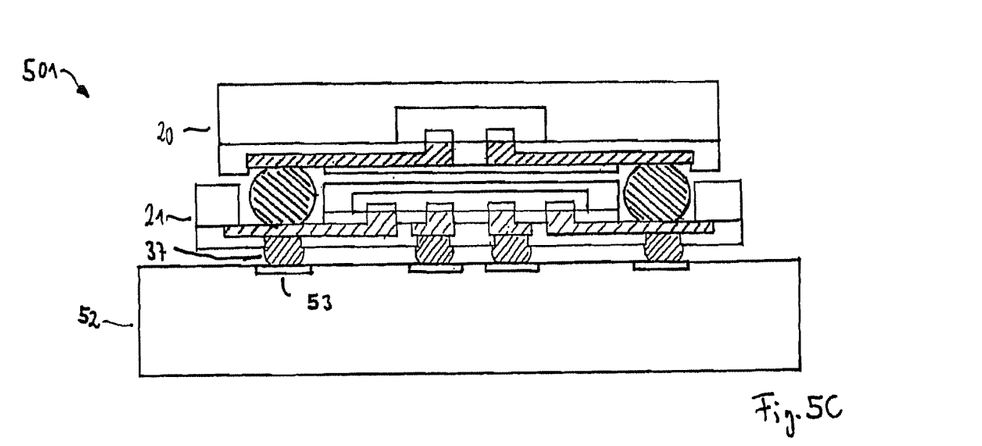

FIGS. 5A to 5C schematically illustrate a cross-sectional view of one embodiment of a method of manufacturing modules 500 and 501, which are illustrated in FIGS. 5B and 5C, respectively. The modules 500 and 501 are implementations of the module 200 illustrated in FIG. 2. The details of the modules 500 and 501 that are described below can therefore be likewise applied to the module 200. Similar or identical components of the modules 200, 500 and 501 are denoted by the same reference numerals.

As illustrated in FIG. 5A, a device 20 and a device 21 are provided. The device 20 includes a semiconductor chip 22 and a plurality of external contact pads 23 electrically coupled to the semiconductor chip 22 via a wiring layer 50. Solder bumps 24 are attached to the external contact pads 23. Furthermore, the semiconductor chip 22 and other components of the device 20 may be embedded in a packaging or housing 51, which may be electrically insulating. The device 20 may be manufactured using one of the manufacturing technologies described above in connection with the manufacturing of the devices 300 and 400. In another embodiment, the device 20 may, for example, be a BGA (ball grid array) device or any other device with contains solder bumps on the bottom side used for external electrical connection of the device. Instead of solder bumps any other external contact elements may be attached to the bottom face of the device 20 that allow the device 20 to stand off from the component on that the device 20 is mounted. Such external contact elements may, for example, be copper posts which may be connected to the external contact pads 23 and have solder deposits on their bottom sides.

The device 21 may, for example, be the device 100, 300 or 400. In the embodiment illustrated in FIG. 5A, the device 21 is embodied as the device 400. The device 21 includes a metal layer 10, a semiconductor chip 11 and an encapsulation material 12. In the encapsulation material 12 through-holes 17 are formed in order to expose portions of the first face 13 of the metal layer 10.

As illustrated in FIG. 5B, the device 20 is stacked on top of the device 21 such that the through-holes 17 receive the solder bumps 24. The solder bumps 24 are placed on the exposed portions of the first face 13 of the metal layer 10. For example, the height $h_2$ of the through-holes 17 may be at least 40% or 50% or 60% or 80% or 90% of the height $h_1$ of the solder bumps 24. Furthermore, the diameter $d_5$ of the solder bumps 24 may equal to or smaller than the diameter $d_6$ of the through-holes 17. In case the device 21 is implemented as the device 300 illustrated in FIG. 3M, each through-hole 17 corresponds to one of the through-holes 38 and the respective through-hole 39. In case the device 21 is implemented as the device 400 illustrated in FIG. 4K, each through-hole 17 corresponds to one of the through-holes 45.

The solder bumps 24 are melted in order to initiate a soldering process which produces soldered joints between the external contact pads 23 of the device 20 and the metal layer 10 of the device 21 so that the devices 20 and 21 are electrically coupled to each other. As a result, the through-holes 17 allow to produce a module 500 consisting of the stacked devices 20 and 21 having a reduced height. It may be provided that further devices are stacked on the module 500.

The module 500 may be mounted on a circuit board 52, for example, a PCB as schematically illustrated in FIG. 5C. The solder bumps 37 of the device 21 may face the circuit board 52. The circuit board 52 may have contact pads 53, and the module 500 may be soldered to the contact pads 53 using the solder bumps 37. It may be provided that melting the solder bumps 24 and melting the solder bumps 37 is performed at the same time.

Figure 6:
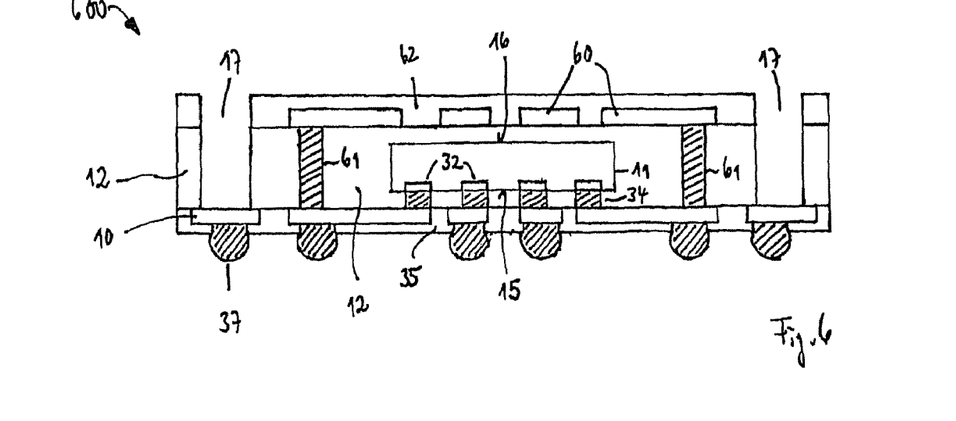
FIG. 6 schematically illustrates a cross-sectional view of one embodiment of a device including a semiconductor chip, a laminate material and a through-hole through the laminate material.
Figure 7:
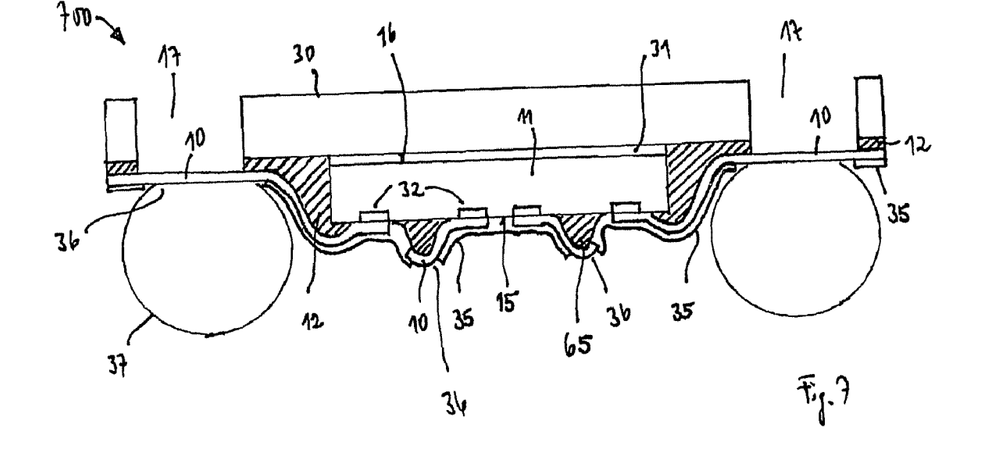
FIG. 7 schematically illustrates a cross-sectional view of one embodiment of a device including a semiconductor chip, a carrier, an encapsulation material and a through-hole through the carrier and the encapsulation material.

FIGS. 6 and 7 schematically illustrate cross-sectional views of a device 600 and 700, respectively. Both devices 600 and 700 are implementations of the device 100 illustrated in FIG. 1. Similar or identical components of the devices 100, 600 and 700 are thus denoted by the same reference numerals. The devices 600 and 700 may be employed as the device 21 illustrated in FIGS. 5A to 5C.

In the device 600 the encapsulation material 12 is a laminate material 12, in which the semiconductor chip 11 is embedded. The laminate material 12 covers the first face 15 and the second face 16 of the semiconductor chip 11. The contact pads 32 of the semiconductor chip 11 are electrically coupled to the structured metal layer 10 via through-connections 34. A structured metal layer 60 is arranged on the other side of the laminate material 12. Both structured metal layers 10 and 60 are electrically coupled to each other by through-connections 61 through the laminate material 12. The structured metal layer 60 is covered with an electrically insulating layer 62, which may be thermally conductive. The metal layers 10, 60 and the through-connections 34, 61 may be produced by electroless and galvanic deposition of a metal or any other appropriate technique. Through-holes 17 extend through the laminate material 12 and expose portions of the metal layer 10. The laminate material 12 may, for example, be a prepreg material, such as FR-2, FR-3, FR-4, FR-5, FR-6, G-10, CEM-1, CEM-2, CEM-3, CEM-4 and CEM-5.

According to one embodiment, the metal layer 60, the through-connections 61 and the electrically insulating layer 62 of the device 600 may also be omitted.

In the device 700 the semiconductor chip 11 is mounted on a carrier 30 using an adhesive material 31, wherein the second face 16 of the semiconductor chip 11 faces the carrier 30. The side faces of the semiconductor chip 11 and the carrier 30 are covered with an encapsulation material 12, which may be the same encapsulation material 12 as used for the device 300 described above. Furthermore, bumps 65 may be formed on the first face 15 of the semiconductor chip 11 by the encapsulation material 12. The structured metal layer 10 may be deposited on the encapsulation material 12 and in one embodiment the bumps 65. An electrically insulating layer 35 is deposited on the structured metal layer 10. The electrically insulating layer 35 leaves external contact elements 36 open at appropriate locations. Solder balls 37 may be placed on the external contact elements 36 located on the carrier 30. Furthermore, through-holes 17 may extend through the carrier 30 and the encapsulation material 12 in order to expose portions of the metal layer 10.

The through-holes 17 may not be arranged directly over the solder balls 37. It may be provided that the through-holes 17 and the solder balls 37 are laterally shifted away from each other. In case the through-holes 17 and the solder balls 37 are positioned on top of each other as illustrated in FIG. 7, the metal layer 10 may have a sufficient thickness in order to be solderable from both sides or may consist of several metal layers.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
   a metal layer comprising a first layer face;
   a semiconductor chip comprising a first chip face, the semiconductor chip being electrically coupled to and placed over the metal layer with the first layer face facing the first chip face;
   an encapsulation material covering the first layer face and the semiconductor chip; and
   at least one through-hole extending through the encapsulation material, the at least one through-hole being open and unfilled and exposing a portion of the first layer face, and wherein the at least one through-hole and the portion of the metal layer exposed therein are physically accessible from outside the device.

2. The device of claim 1, comprising wherein the at least one through-hole having a cross section of at least $3 \times 10^4$ $\mu m^2$.

3. The device of claim 1, further comprising:
   an array of solder bumps electrically coupled to a second layer face of the metal layer, the second layer face being opposite to the first layer face.

4. The device of claim 1, further comprising:
   a second metal layer covering a second chip face of the semiconductor chip and a surface of the encapsulation material opposite a surface of the encapsulation material covering the first layer face of the metal layer, the second chip face being opposite to the first chip face.

5. The device of claim 4, wherein the at least one through-hole extends through the second metal layer as well as through the encapsulation material.

6. The device of claim 4, comprising wherein a cross section of the at least one through-hole where it passes through the second metal layer is larger than a cross section of the through-hole where it passes through the encapsulation material.

7. The device of claim 4, comprising wherein a first material is arranged between the second chip face and the second metal layer, the first material comprising silicone.

8. The device of claim 1, comprising wherein the encapsulation material has an elastic modulus of less than 100 MPa.

9. The device of claim 1, comprising wherein the encapsulation material comprises silicone.

10. The device of claim 1, comprising wherein the at least one through-hole has a cross section of at least $6 \times 10^4$ $\mu m^2$.

11. The device of claim 1, comprising wherein the at least one through-hole extends in a direction orthogonal to the first layer face.

12. The device of claim 1, comprising wherein the at least one through-hole has a length of at least 150 $\mu m$.

13. The device of claim 1, wherein the semiconductor chip comprises an array of contact elements arranged on the first chip face.

14. A device, comprising:
   a carrier;
   a first material deposited on the carrier, the first material having an elastic modulus of less than 100 MPa;
   a semiconductor chip placed over the first material;
   a second material deposited on the carrier and the semiconductor chip, the second material having an elastic modulus of less than 100 MPa;
   a metal layer comprising a first face and a second face opposite to the first face, the metal layer being placed over the second material with its first face facing the second material; and
   at least one through-hole extending from the first face of the metal layer through the second material to the carrier, the at least one through-hole being open and unfilled, wherein the at least one through-hole and a portion of the carrier exposed therein are physically accessible from outside the device.

15. The device of claim 14, comprising wherein at least one of the first material and the second material comprises silicone.

16. The device of claim 14, comprising wherein at least one of the first material and the second material is electrically insulating.

17. The device of claim 14, wherein the at least one through-hole has a cross section of at least $3 \times 10^4$ $\mu m^2$.

* * * * *

UNITED STATES PATENT AND TRADEMARK OFFICE
CERTIFICATE OF CORRECTION

| | | |
|---|---|---|
| PATENT NO. | : 8,183,677 B2 | |
| APPLICATION NO. | : 12/324420 | |
| DATED | : May 22, 2012 | |
| INVENTOR(S) | : Georg Meyer-Berg | |

It is certified that error appears in the above-identified patent and that said Letters Patent is hereby corrected as shown below:

Title Page, at References Cited, insert --OTHER PUBLICATIONS--.

Title Page, at OTHER PUBLICATIONS, insert --"Embedded Wafer Level Ball Grid Array (eWLB)", M. Brunnbauer, et al., Electronics Packaging Technology Conference, December 6-8, 2006 IEEE--.

Signed and Sealed this
Twenty-eighth Day of August, 2012

David J. Kappos
*Director of the United States Patent and Trademark Office*